United States Patent [19]

Supnet

[11] 4,088,545

[45] May 9, 1978

[54] METHOD OF FABRICATING MASK-OVER-COPPER PRINTED CIRCUIT BOARDS

[76] Inventor: Fred L. Supnet, 1185 Autumnsong Way, San Jose, Calif. 95100

[21] Appl. No.: 763,873

[22] Filed: Jan. 31, 1977

[51] Int. Cl.² .......................... C25D 5/02; C25D 5/54
[52] U.S. Cl. ...................................... 204/15; 427/97
[58] Field of Search ............. 204/15, 16, 40; 29/624, 29/625, 628; 156/3, 8; 427/96, 97

[56] References Cited

U.S. PATENT DOCUMENTS

| | | | |
|---|---|---|---|
| 2,872,391 | 2/1959 | Hauser et al. | 204/15 |
| 2,912,312 | 11/1959 | Japel | 204/15 |
| 3,060,076 | 10/1962 | Robinson | 204/15 |
| 3,143,484 | 8/1964 | Olin et al. | 204/15 |
| 3,208,921 | 9/1965 | Hill | 204/15 |
| 3,475,284 | 10/1969 | Olson | 240/15 |
| 3,702,284 | 11/1972 | Merkenschlager | 204/15 |

Primary Examiner—T. M. Tufariello

Attorney, Agent, or Firm—Limbach, Limbach & Sutton

[57] ABSTRACT

A method of fabricating mask-over-copper printed circuit boards from a laminated insulated board material having conductive metallic coatings on both sides thereof includes piercing a plurality of holes completely through the laminate, forming a desired circuit connection pattern of copper extending between selected holes on the laminate first side and electrically connecting the laminate first side connection pattern to the second side copper coating by depositing copper material through the holes. A solder mask is applied to the areas of the first side connection pattern which are to be protected from solder during subsequent fabrication steps and then a protective metallic material is electroplated to portions of the first side connection pattern not covered by the solder mask and to desired portions of a circuit connection pattern on the second side conductive metallic coating, and the portions of the laminate second side conductive metallic coating outside the second side connection pattern are then removed.

17 Claims, 5 Drawing Figures

METHOD OF FABRICATING MASK-OVER-COPPER PRINTED CIRCUIT BOARDS

BACKGROUND OF THE INVENTION

The most commonly used form of printed circuit board is one having a tin/lead coating fused over copper. This type of board has proven adequate as long as the board is to be hand soldered, but has been undesirable when soldered in a wave soldering machine, since many conductors in the connection pattern on the board are thus inadvertently soldered together, forming improper circuit connections. To overcome this problem with wave soldering, subsequent prior art printed circuit boards have applied a solder resist mask over any area of the board, including the tin/lead coated copper circuitry, which was to be protected from solder in subsequent fabrication steps. This solder mask over tin/lead technique has proved satisfactory in certain applications in that it eliminated the majority of the shorting problems and unintentional connections. However, because the mask was applied over the tin/lead coating on the circuitry, when the board was later subjected to the wave of molten solder, the mask frequently broke off the circuit areas intended to be protected since the tin/lead supporting the mask could melt under the temperature of the solder and thus no longer provide mechanical support to the mask.

Due to the disadvantages of the mask-over-tin/lead technique, a subsequent technique of applying the solder mask directly over the bare copper was developed. In the fabrication of this board the mask is applied over the bare copper circuit connection pattern but is left off any area that is to be soldered during subsequent fabrication steps. However, because unprotected copper oxidizes and thus loses some of its solderability during the time between the fabrication of the board itself and the assembly and soldering of components thereto, it was necessary to provide a protective coating to the unmasked areas of exposed copper. The preferred material for such protective coating is generally a tin/lead material to tin the contacts for later soldering. To provide good oxidation resistance to the copper beneath the tin/lead coating, and therefore good solderability, it is preferred to have the coating of tin/lead of a thickness between about 0.0003 inches and 0.0005 inches. In the prior art method of fabricating mash-over-copper boards, this protection is applied after the solder mask is applied to the board by dipping the board into molten solder and then removing any excess solder by one of several methods. One of the most common methods is the spraying of hot oil under pressure at a temperature of about 500° F over the board, thus blowing most of the solder off the copper and out of holes through the board. This technique, by providing a mask-over-copper board having a tin/lead coating over exposed copper, has proved adequate for certain applications but still suffers from numerous disadvantages. Among these disadvantages is the time-consuming nature of the solder dip process, thus slowing production of the boards. Additionally, the sudden application of 500° F temperature oil to the board causes an extreme thermal shock that may result in delamination of the insulating base, delamination of the copper foil from the base laminate and other faults that tend to result in a high rejection rate. There also are dangers to the workers fabricating the boards in that the molten solder from the solder dip process and hot oil at 500° F from the cleaning process may be splashed out toward the operator, thus possibly causing injury. Both the solder dip tank and the hot oil spray machine also produce large amounts of smoke, requiring both large ventilation systems and elaborate fume scrubbing systems. Finally, one of the most significant disadvantages results from the very nature of the process of removing the excess solder, some of which plugs up the holes through the boards. In spraying the solder-coated board with the hot oil long enough to unplug the holes, the desired tin/lead coating over the circuit connection points is also reduced below desirable limits, generally down to a thickness of only from 0.000020 to 0.000080, far thinner than the desired (and Mil-spec required) minimum thickness of 0.00030. With such an undesirably thin coating of the tin/lead material, the copper below frequently was not adequately protected from oxidation, thus permitting oxidation to occur, providing poor shelf life for the board and resulting in poor solderability.

The various problems encountered in fabricating printed circuit boards have thus spawned numerous experiments in developing other processes, as described in patents to Olen et al U.S. Pat. No. 3,143,484, Johnson U.S. Pat. No. 3,457,638, Degnan et al. U.S. Pat. No. 3,649,475, and Keen U.S. Pat. No. 3,554,876. However, none of these patents addressed the problem of providing a mask-over-copper printed circuit board having a desirable thick coating of protective metallic material over the copper areas not covered by the solder mask.

SUMMARY OF THE INVENTION

In view of the numerous disadvantages of the prior art processes, it is an object of the present invention to provide a method of fabricating printed circuit boards having a solder mask over bare copper and featuring good shelf life and solderability. It is a further object of this invention to provide such a method in which the board is not subjected to the thermal shock of the molten solder or hot oil baths and in which the solder coating can be controlled to any desired thickness. Further, it is an object of the invention to provide such a method of producing mask-over-copper boards which lends itself well to mass production techniques and which eliminates the requirement for expensive ventilation and smoke control equipment.

Briefly, this invention contemplates a method of fabricating a mask-over-copper printed circuit board having circuit connections on both sides and a solder mask covering portions of at least one side, the printed circuit board being fabricated from a laminate of insulating board being fabricated from a laminate of insulating board material having an electrically conductive coating of copper extending across and laminated to each of the opposed first and second sides of the insulating board material. The method includes the steps of piercing a plurality of holes completely through the laminate and forming a desired circuit connection pattern of the laminate copper coating extending between selected such holes on the laminate first side by selective removal of undesired portions of the laminate first side copper coating. Additionally, the method includes electrically connecting the laminate first side connection pattern by conductive metallic material deposited extending through the holes to the laminate second side copper coating, applying a solder mask to the areas of the first side copper connection pattern which are to be protected from solder during subsequent fabrication steps and then electroplating a protective metallic material to portions of the first side connection pattern copper material not covered by the solder mask and to portions of a desired circuit connection pattern on the second side copper coating. This electroplating is facilitated by the electrical continuity among all portions of the first side connection pattern provided by the deposited conductive metallic material joining the first side connection pattern to the second side copper coating which extends across the board second side. A final step comprises removing the portions of the laminate second side copper coating which are outside the second side connection pattern, whereby a printed circuit board may be produced having connection patterns on both sides and a solder mask over selected portions of at least the first side connection pattern.

BRIEF DESCRIPTION OF THE DRAWINGS

FIG. 2b illustrates the remaining steps in practicing the embodiment of the method of FIG. 2a.

DESCRIPTION OF PREFERRED EMBODIMENTS

Figure 1A:
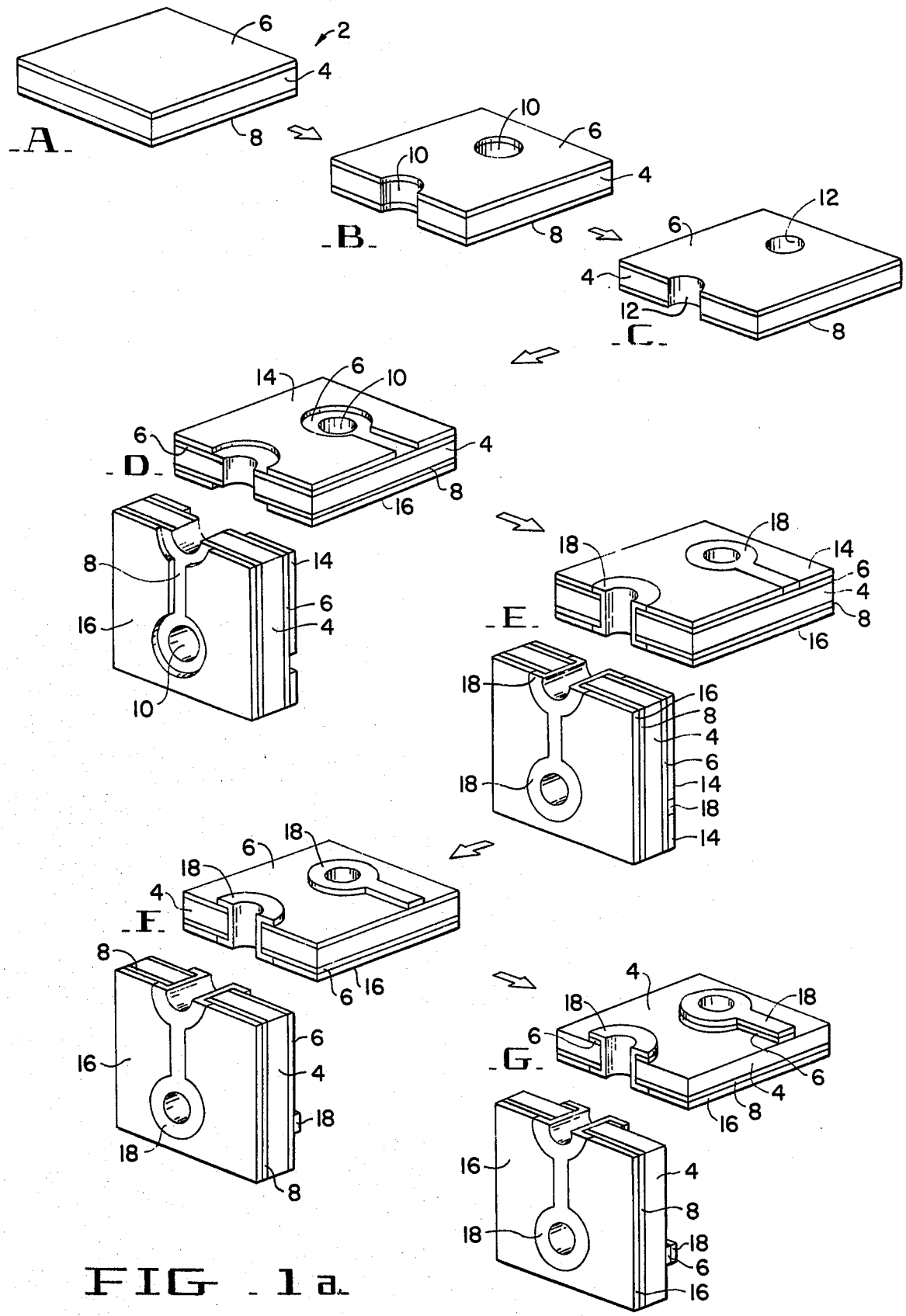
FIG. 1a illustrates pictorially the initial steps of a preferred embodiment of the printed circuit board fabrication method of this invention, illustrating the development of the structure on both sides of the board.
Figure 1B:
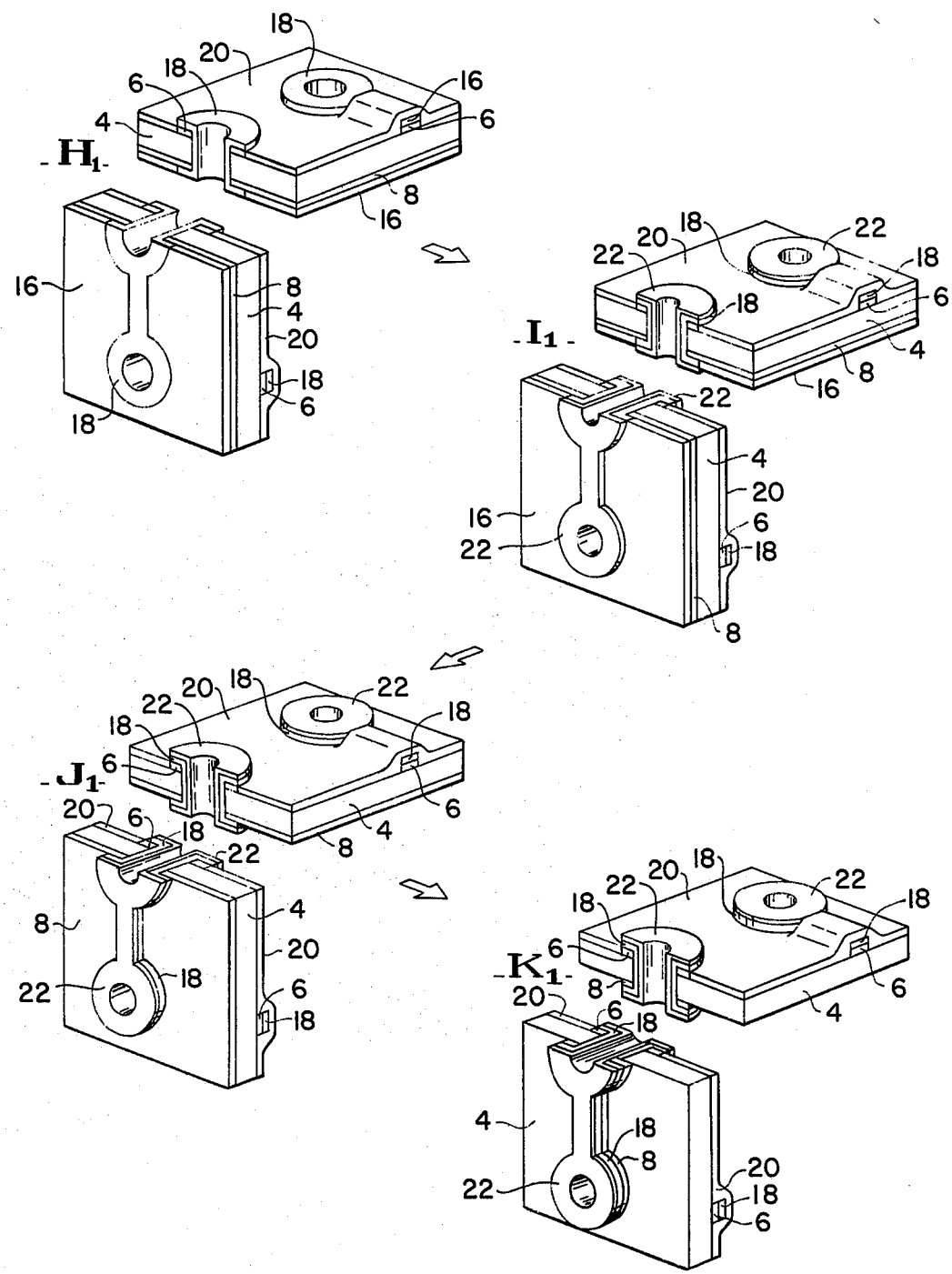
FIG. 1b illustrates pictorially the remaining steps of one variation of the embodiment of FIG. 1a to produce a board having a mask over copper on one side thereof.
Figure 1C:
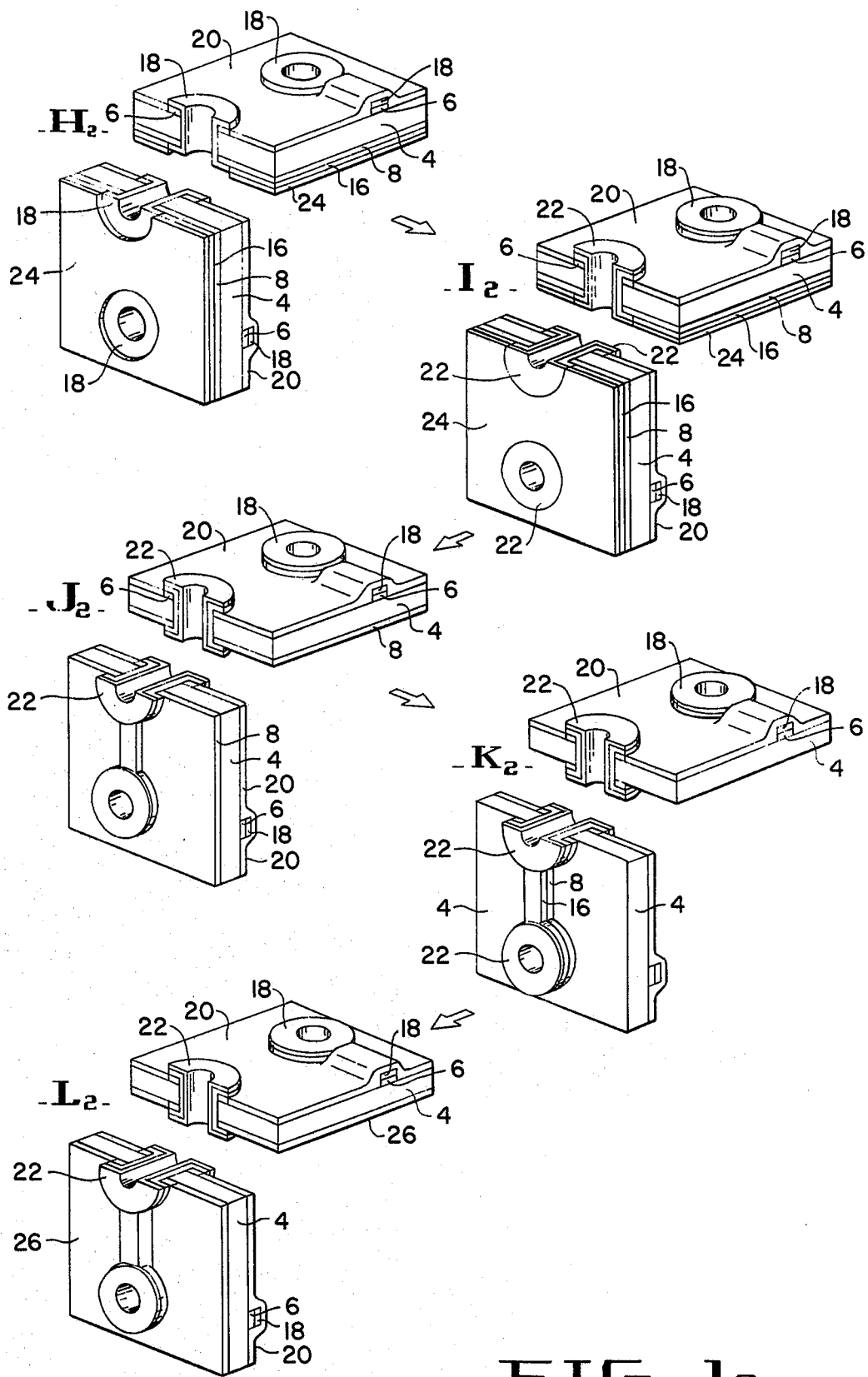
FIG. 1c represents the remaining steps of a second variation of the embodiment of the method of FIG. 1a to produce a board having a mask over copper on both sides.

A particularly preferred embodiment of the printed circuit board fabrication method of this invention is illustrated in FIGS. 1a through 1c, with FIG. 1a representing the initial steps common to two variations of this embodiment and FIGS. 1b and 1c, respectively, illustrating the remaining steps in the two slight variations of this embodiment of the method. The process illustrated in FIGS. 1a and 1b provides a printed circuit board having a mask-over-copper on one side, while the embodiment illustrated in FIGS. 1a and 1c provides a printed circuit board having a mask-over-copper in both sides of the board.

The basic material from which the printed circuit boards of this invention is fabricated is illustrated in step A of FIG. 1a and comprises a laminate generally indicated by reference numeral 2 comprising a board of insulating material 4, such as phenolic, fiberglass or other suitable material, having an electrically conductive coating of metallic material extending across and laminated to each side of the board, thus providing a first side conductive metallic coating 6 and a second side conductive metallic coating 8, both suitably of copper. For purposes of illustration and explanation only a small portion of a printed circuit board fabricated by the processes of this invention is illustrated, and this portion of the board is illustrated on a greatly expanded scale with the thicknesses of various components exaggerated for purposes of clarity of illustration. As a first step (step B of FIG. 1a) in this fabrication process a desired pattern of holes is pierced completely through all three layers of the laminate, and a suitable electrically conductive metal 12, such as copper, is deposited (step C) extending through the holes and coating the hole walls, thus providing electrical continuity between the first side metallic coating 6 and the second side metallic coating 8. Next, in step D, the first side of the laminate is coated with a conventional first plating resist 14 which is removable in a predetermined and well known stripping agent, such as sodium hydroxide. This plating resist 14 is applied to the portions of the laminate first side metallic coating 6 which are to be removed by etching in a first subsequent etching operation and thus serves to define a desired first side circuit connection pattern extending between selected holes 10 through the board. Subsequently, also in step D, a section plating resist material 16 is applied to portions of the laminate second side metallic coating 8, covering areas of the laminate where the second side metallic coating is to be removed in a second subsequent etching operation, such that the areas not covered by the second plating resist material define a desired second side circuit connection pattern extending between selected holes 10. This second plating resist 16 is a conventional material known in the art which resists removal by agents which serve to remove the first side plating resist 14 but is dissolved in a different form of stripping agent, such as a solvent stripper. At this point the areas of bare metallic material 6 and 8 which are exposed on the opposite sides of the laminate define the circuit connection pattern which is desired to be obtained on the printed circuit board.

With portions of both sides covered by the plating resist materials 14 and 16, a layer of copper 18 is electroplated in step E onto the areas not covered by the plating resist 14 and 16. This layer of copper 18 will serve to prevent the removal of the circuit connection patterns when the undesired areas of the laminate metallic coatings 6 and 8 are subsequently removed by etching. In this step, there is no problem of electrical conductivity and continuity to facilitate the electroplating since the entire metallic coatings 6 and 8 are still present extending across their respective sides of the board.

In the next step, step F, the first plating resist 14 is removed from the laminate first side in a conventional manner using a suitable process and materials to remove only that first side plating resist coating 14 while leaving intact the second side resist coating 16. Thus, on the first side, the metallic coating 6 having the layer of electroplated copper 18 is exposed.

Subsequently, in step G, the undesired areas of the laminate first side metallic coating 6, those areas previously covered by the first plating resist material 14, are removed by etching the first side of the board in a first etching operation. Since the areas of the laminate metallic coatings previously covered by plating resist 14 are very thin compared to those areas upon which the additional plating of copper 18 took place, a substantial thickness of the combination of copper 18 and its underlying portions of the metallic material 6 will remain to form the circuit connections after the undesired other areas of the laminate first side copper coating 6 have been dissolved away, thus leaving only the desired circuit connection pattern on the first side of the insulating board 4, as illustrated in FIG. G. During this first side etching process suitable well-known techniques and materials are used such that the areas of the second side conductive metallic coating 8, which are covered with plating resist 16, are not removed from the second side of the board. Thus, by virtue of the conductive metallic material extending through the holes in the board, the circuit connection patterns on the first side of the board are electrically connected to the conductive metallic coating extending across the second side, thus providing electrical continuity throughout the first side circuit connection pattern.

In a slight variation on the foregoing steps of this process it may be desirable in the electroplating step to electroplate an additional layer of a different protective metal, such as a tin/lead alloy, over the electroplated copper, to provide additional protection of that electroplated copper against the action of the first side etching materials. If this additional layer of protective metal is electroplated onto the electroplated copper, it should be removed by a tin/lead stripping solution, which does not attack copper, directly after the first side etching to provide bare copper for subsequent application of the solder mask.

At this point a decision must be made as to whether the circuit board, while having circuit connection patterns on both sides, is to have a solder mask over bare copper on one side only or on both sides. If a mask over copper is desired on only one side, the remaining steps of the method of this invention are those illustrated in FIG. 1b and labeled $H_1$ through $K_1$. Conversely, if the mask over copper is desired on both sides of the board, the remaining steps are those illustrated in FIG. 1c numbered $H_2$ through $L_2$.

If a mask over copper on only one side of the board is desired, the next step, step $H_1$, comprises the application of a conventional solder mask 20 to the portions of the laminate first side which are desired to be protected from solder in subsequent fabrication operations, such as the installation and connection of components. Conventionally, the connection points surrounding the holes through the circuit board will be left uncovered by the solder mask 20.

In subsequent step $I_1$ a protective conductive metallic material 22, preferably a tin/lead alloy or gold, is electroplated onto the portions of the electroplated copper 18 that are not covered by the solder mask. This protective metallic coating 22 is plated onto the exposed copper areas of both the first and second sides of the board and also through the holes extending through the board. By the application of this protective coating 22 through electroplating, it is possible to control carefully the thickness of the coating and to coat it to any desired thickness, such as the preferred 0.0003 to 0.0005 inch thickness. This step of electroplating the various portions of the circuit pattern on the first side of the circuit board is possible due to the electrical continuity provided by the metallic deposition 12 extending through the holes in the board to the generally continuous second side metallic coating 8. This protective metallic coating 22 is applied to protect the otherwise exposed copper from oxidation and to provide for good solderability to the circuit pattern.

After the protective metallic coating 22 has been applied to the otherwise exposed areas of bare copper 18, the second plating resist 16 which had been applied to various areas of the board second side is removed by a suitable and conventional solvent. This removal of the second side plating resist 16 provides a circuit board illustrated in step $J_1$ of FIG. 1b, in which the full second side conductive metallic coating 8 remains on the board second side and in which the desired circuit pattern is defined by the electroplated areas of copper 18 and the protective metallic coating 22.

To complete the board having a mask over bare copper on one side, the undesired portions of the laminate second side conductive metallic coating 8 are removed by etching the board second side in a conventional etching solution, thus removing all of the copper from that side of the board except where the electroplated build-up was formed. The additional electroplated copper 18 and protective metallic coating 22, and control of the etching process and time, prevent the removal of the desired built up circuit connection pattern on the board second side. At completion of this step, shown in step $K_1$, the printed circuit board is completed and ready for connection of other electronic components thereto, the board having a mask over bare copper on one side and having all exposed circuit pattern areas plated with a solderable protective metallic coating 22.

If a printed circuit board having a solder mask over bare copper on both sides is desired, the steps $H_2$ through $L_2$ on FIG. 1c may be folowed in practicing this invention. In step $H_2$, following step G from FIG. 1A, a suitable solder mask 20 is applied to the portions of the laminate first side which are desired to be protected from solder in subsequent fabrication operations. Thus, this solder mask 20 is applied over the insulating board 4 and over portions of these bare electroplated copper 18 which are to be protected from solder. Also, a second layer 24 of the second side plating resist is applied over all portions of the second side where it is desired to prevent deposition of the protective conductive metallic material 22, which generally corresponds to the areas of the laminate second side which are subsequently to be covered by solder mask. Next, as illustrated in step $I_2$, the previously described protective metallic coating 22 is electroplated onto the remaining exposed areas of copper 18. As before, this protective metallic coating preferably comprises either a tin/lead alloy or gold and resists oxidation of the underlying copper while providing for good subsequent solderability.

After the protective metallic coating 22 has been electroplated onto the desired portions of the circuit board, both layers 16 and 24 of the second side plating resist are stripped from the laminate second side, thus exposing both the plated circuit connection pattern and the other areas of the second side copper coating 8 which are unnecessary and now undesired, as illustrated in step $J_2$. When this plating resist 16 and 24 has been removed from the second side, the second side conductive metallic coating 8 is removed from the areas previously covered by the layer 16 of plating resist, suitably by etching in a second etching operation using a conventional etching material. At completion of this etching step $K_2$ only the desired circuit connection pattern remains on the board, formed of the electroplated build-up of copper 18 and the protective metallic coating 22 over the base laminate.

To complete this printed circuit board having a mask over copper on both sides, a second solder mask 26 is applied to the portions of the laminate second side which are desired to be protected from solder in subsequent fabrication operations such as connection and attachment of other electronic components.

From the foregoing description, it may be seen that the basic steps involved in forming the printed circuit board of this invention comprise piercing a desired pattern of holes through all three layers of the laminate and forming a desired circuit connection pattern of the laminate first side copper coating extending between selected holes on the laminate first side by selective removal of undesired portions of that laminate first side copper coating. The first side connection pattern is then electrically connected by copper material deposited extending through the holes to the laminate second side copper coating which extends across the laminate second side, thus providing electrical continuity among the various holes and connections by virtue of the second side copper coating. In other steps a solder mask is applied to the areas of the first side connection pattern which are to be protected from solder during subsequent fabrication and soldering steps, and then a protective metallic material is electroplated to portions of the first side connection pattern copper material which are left exposed and not covered by the solder mask, as well as to desired portions of a circuit connection pattern on second side copper coating. This electroplating is done while the second side copper coating remains extending across the laminate second side and thus provides electrical continuity. The other basic step of the process comprises removing the portions of the laminate second side copper coating which are outside the desired second side connection pattern, thus producing a printed circuit board having connection patterns on both sides and a solder mask over selected portions of at least the first side copper connection pattern.

Figure 2A:
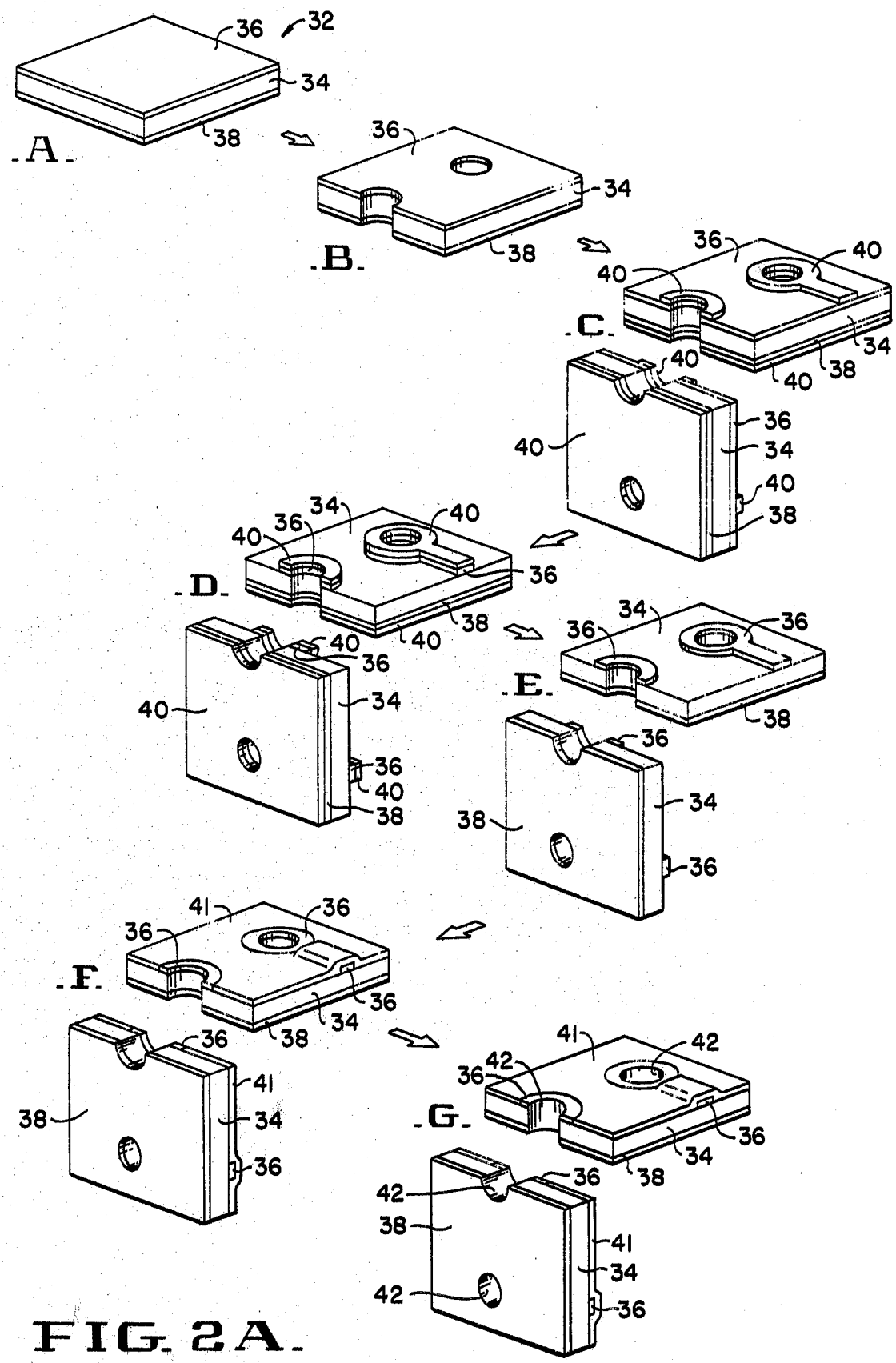
FIG. 2a illustrates the initial steps of a second embodiment of the method of this invention.
Figure 2B:
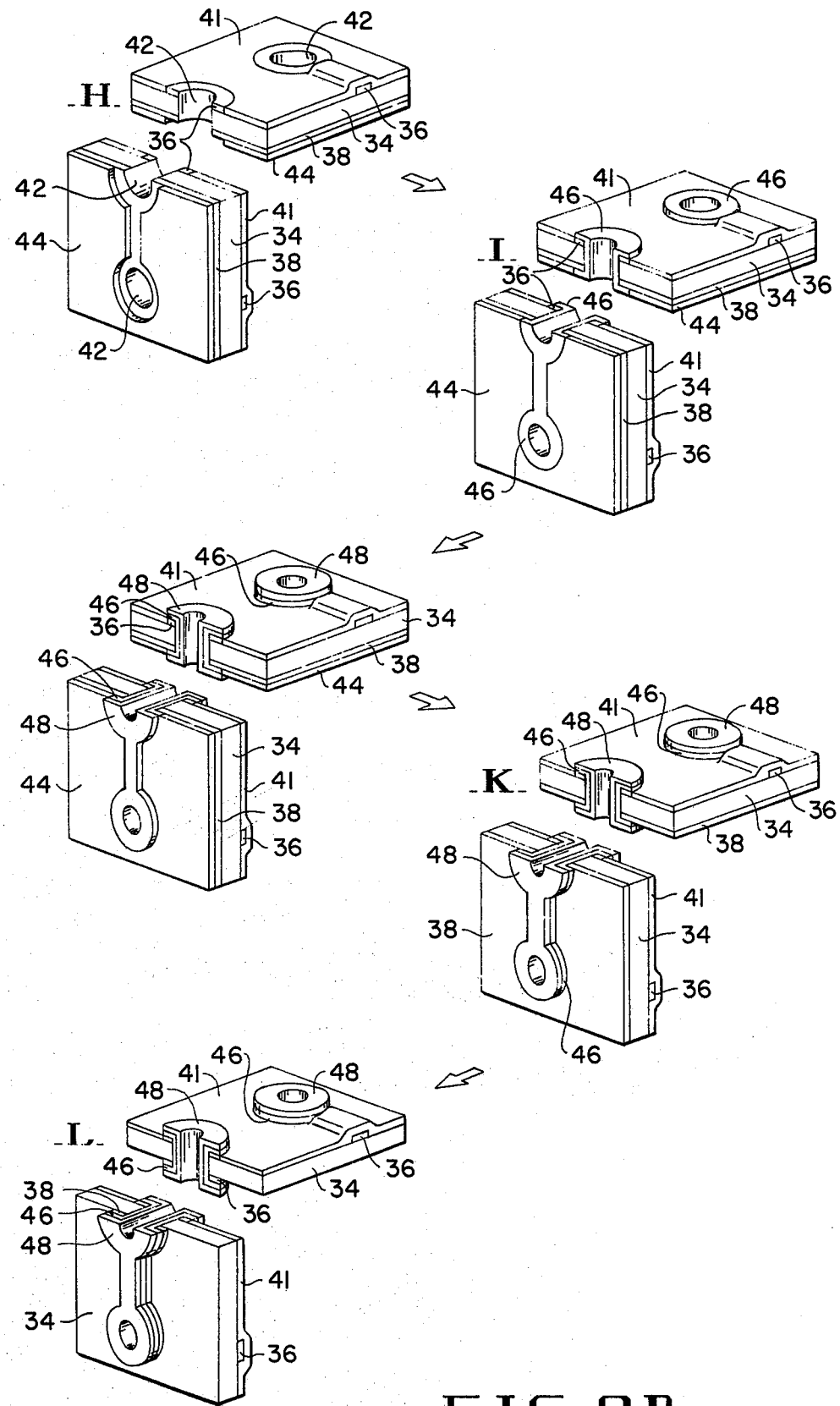

Another embodiment of the method of this invention for producing a mask over copper printed circuit board is illustrated in FIGS. 2a and 2b. In this embodiment the basic laminate material 32 may suitably be the same as described in the previous embodiment, comprising an insulating board 34 of phenolic or glass fiber epoxy having a first coating 36 of a conductive metallic material such as copper on its first side and a second coating 38 of conductive metallic material such as copper on the second side of the board, as illustrated in step A of FIG. 2a.

As previously described, the next step, illustrated in step B, is that of piercing a desired pattern of holes completely through the three layers of the laminate. Subsequently, a first protective material 40 for resisting etching is applied to the areas of the first side copper coating which define a desired first side circuit connection pattern extending between selected holes previously formed. The second side copper coating 38 of the laminate desirably is completely coated with this etch resisting material 40 as illustrated in step C.

After the laminate has been so selectively protected with the etch resisting material, the first side copper coating 36 is removed, suitably by etching, from the areas of the first side which are not covered by the protective material, thus forming the first side circuit connection pattern, as illustrated in step D. After this etching process is completed, the first side of the laminate comprises the bare insulating board 34 except for the areas covered by the protective material, which define the first side connection pattern. In these areas the protective material 40 and the underlying copper coating 36 remain. In the next step, step E, the protective material 40 is removed from the first side of the laminate, and suitably also from the second side of the laminate, as illustrated in step E.

Next, in this embodiment of the method of this invention a solder mask 41 is applied to the portions of the laminate first side which are desired to be protected from solder in subsequent fabrication steps, as illustrated in step F. With this solder mask in place a conductive metallic material 42 is deposited by a suitable process, such as electroless chemical deposition, extending through the holes between the laminate first and second side copper coating 36 and 38, as illustrated in step G. This deposition of conductive metal 42 serves to provide electrical continuity through the holes between the laminate first and second side copper coatings. Thus, the otherwise isolated portions of the first side connection pattern are connected electrically to the copper coating 38 extending across the second side such that all portions of the first side connection pattern have electrical continuity among themselves and with the second side copper coating.

As a generally contemporaneous or immediately following step, a plating resist material 44 is applied to the areas of the laminate second side copper coating 38 which are to be removed in a subsequent etching operation, in a manner such that the portions not covered by this coating 44 define a desired second side circuit connection pattern extending between various selected holes through the board, as illustrated in step H. Next, as illustrated in step I, a suitable conductive metal 46 is electroplated to the areas of both sides of the laminate not covered by either the first side solder mask 41 or the second side plating resist material 44. This conductive metal may suitably be copper 46, as illustrated in step I, followed by a subsequent electroplating deposition of protective metallic material 48 such as a tin/lead alloy or gold, as illustrated in step J. Where this electroplated conductive metal comprises both the copper 46 and then the overplating of tin/lead or gold 48, the copper 46 serves to build an additional thickness of material such that the circuit pattern will remain after a subsequent etching process that removes the unplated portions of the second side copper coating 38, and the tin/lead or gold protects that copper from oxidation and provides for enhanced solderability in subsequent fabrication operations. This electroplating is facilitated by the electrical continuity provided by the deposited metal 42 linking the first side connection pattern to the laminate second side copper coating 38. By the use of this electroplating, any desired thickness of the protective metallic material (such as tin/lead or gold) may be deposited, as this thickness may be accurately controlled to provide desired protective and solderability characteristics.

After the plating is completed, the plating resist material 44 is removed from the laminate second side copper coating 38 to which it had been previously applied, thus leaving the areas of the laminate second side copper coating 38 exposed, as illustrated in step K. At this point, the second side connection pattern is clearly defined by the material electroplated in the preceding steps. The final step in fabricating the mask-over-copper printed cirucit board of this embodiment is the removal by etching of the laminate second side copper coating 38 from all areas where no metal was deposited by the electroplating steps. The manner and duration of this etching process is controlled so that the electroplated material defining the second side cirucit connection pattern remains, thus forming the connection pattern, while the other undesired areas of the second side copper coating 38 are removed. Thus, by this embodiment of the method of the present invention a printed circuit board is produced having conductive connection patterns on both sides and a solder mask over bare copper on at least one side.

While several embodiments and variations of the method of this invention have been described in detail above, it is to be recognized that numerous additional variations and modifications of this method, all within the scope of the invention, will readily occur to those skilled in the art. Accordingly, the foregoing descriptions are to be considered only as illustrative of the principles of the invention and are not to be considered as limitative thereof. The scope of this invention is to be defined solely by the claims appended hereto.

What is claimed is:

1. A method of fabricating a mask-over-copper printed circuit board having circuit connections on both sides thereof and a solder mask covering portions of at least one side thereof, from a laminate of insulating board material having an electrically conductive coating of copper extending across and laminated to each of the opposed first and second sides thereof, comprising the steps of
   (a) piercing a desired pattern of holes completely through all three layers of said laminate;
   (b) forming a desired circuit connection pattern of said laminate copper coating extending between selected said holes on said laminate first side by selective removal of undesired portions of said laminate first side copper coating;
   (c) electrically connecting said laminate first side connection pattern by conductive metallic material deposited extending through said holes to said laminate second side copper coating extending across said laminate second side, whereby electrical continuity may be maintained among the various holes and connections by said second side copper coating;
   (d) applying a solder mask to the areas of said first side copper connection pattern which are to be protected from solder during any subsequent fabrication soldering steps and then electroplating a protective metallic material to portions of the first side connection pattern copper material not covered by said solder mask and to desired portions of a circuit connection pattern on said second side copper coating while said laminate second side copper coating remains extending across said laminate second side; and
   (e) removing the portions of said laminate second side copper coating outside said second side connection pattern, whereby may be produced a printed circuit board having connection patterns on both sides thereof and a solder mask over selected portions of at least the first side copper connection pattern.

2. The method of claim 1 wherein said solder mask is applied prior to said deposition of conductive metallic material through said holes.

3. The method of claim 2 further including the step of electroplating copper prior to said protective metallic material and onto the same areas to which said protective metallic material is to be plated.

4. The method of claim 1 wherein said electroplated protective metallic material comprises a tin/lead alloy.

5. The method of claim 1 wherein said electroplated protective metallic material comprises gold.

6. The method of claim 1 wherein said deposited conductive metallic material is deposited through said holes prior to said formation of said first side connection pattern.

7. The method of claim 6 wherein said first side connection pattern is formed by plating additional said copper material onto the areas of said laminate first side comprising said connection pattern prior to said removal of said portions of said first side copper coating outside said second side connection pattern.

8. The method of claim 1 further including the step of applying, prior to said electroplating, a plating resist coating to prevent plating of said protective metallic material to the portions of said second side copper connection pattern which are desired to be covered by a solder mask, and then, after electroplating said protective metallic material, removing said plating resist coating and applying a solder mask to said second side copper connection pattern portions which are to be protected from solder during any subsequent fabrication soldering steps, whereby may be obtained a printed circuit board having solder masks over copper on both sides thereof.

9. A method of fabricating a mask-over-copper printed circuit board having circuit connection patterns on both sides thereof from a laminate of insulating board material having a conductive coating of copper material laminated to each of the opposed first and second sides thereof, comprising the steps of
   (a) piercing a desired pattern of holes through said laminate;
   (b) applying a first protective material to the areas of said first side copper coating defining a desired first side circuit connection pattern extending between selected said holes;
   (c) removing said laminate first side copper coating from the areas of said first side not covered by said first protective material, whereby the first side circuit connection pattern is formed;
   (d) removing said first protective material from said laminate;
   (e) applying a solder mask to the portions of said laminate first side which are desired to be protected from solder in any subsequent fabrication soldering steps;
   (f) depositing a conductive metallic material onto said laminate extending through said holes between said first and second side copper coatings, whereby electrical continuity may be established through said holes between the laminate first and second side copper coatings;
   (g) applying a plating resist material to areas of said laminate second side copper coating which are to be removed in a subsequent etching operation such that the portions not covered by said coating define a desired second side circuit connection pattern extending between selected said holes;
   (h) electroplating a conductive metal to the areas of said laminate not covered by either said solder mask or said plating resist material;
   (i) removing said plating resist material from said laminate second side copper coating; and
   (j) etching said laminate second side to remove completely said second side copper coating from all areas where no metal was deposited by said electroplating, whereby may be produced a printed circuit board having conductive connection patterns on both sides thereof and a solder mask over copper on at least one side thereof.

10. The method of claim 7 wherein said conductive metal electroplated onto said laminate includes a first layer of copper and a second layer of protective metallic material electroplated thereover, whereby the protective metallic material may serve to resist oxidation of the copper thereunder 11. The method of claim 10 wherein said electroplated protective metallic material comprises a tin/lead alloy.

12. The method of claim 10 wherein said electroplated protective metallic material comprises gold.

13. A method of fabricating a mask-over-copper printed circuit board from a laminate of insulating board material having an electrically conductive metallic coating laminated to the opposed first and second broad surfaces thereof, comprising the steps of
- (a) piercing a desired pattern of holes through the laminate;
- (b) depositing an electrically conductive metallic coating to said laminate extending through said holes between said laminate conductive metallic coatings;
- (c) applying a first plating resist material to the portions of said laminate first side conductive metallic coating which are to be removed by etching in a first subsequent etching operation, such that the areas not covered by said first plating resist material define a desired first side circuit connection pattern extending between selected said holes;
- (d) application of a second plating resist material to portions of said laminate second side conductive metallic coating, covering areas of said laminate where said metallic coating is to be removed in a second subsequent etching operation, such that the areas not covered by said second plating resist material define a desired second side circuit connection pattern extending between selected said holes;
- (e) a first electroplating step for electroplating copper to the areas of said laminate not covered by either said first or said second plating resist material;
- (f) removing said first plating resist material from said first side of said laminate;
- (g) removing said laminate conductive metallic coating only from said areas previously covered by said first plating resist material by etching in a first etching operation using a first etching material, whereby a conductive connection pattern is formed on the laminate first side;
- (h) applying a first side solder mask to the portions of said laminate first side which are desired to be protected from solder in subsequent fabrication operations of said printed circuit boards;
- (i) a second electroplating step for electroplating a protective conductive metallic material onto the areas of copper deposition on said laminate which are not covered by said solder mask;
- (j) removing said second plating resist material from said laminate second side; and
- (k) removing said laminate second side conductive metallic coating from said areas previously covered by said second plating resist material by etching in a second etching operation using a second etching material, whereby a conductive metallic connection pattern is formed on the laminate second side.

14. The method of claim 13 further comprising the steps of applying, prior to said second electroplating step, an additional layer of said second plating resist material to the portions of the exposed conductive metal on said laminate second side where it is desired to prevent deposition of said protective conductive metallic material and, subsequent to said second etching operation, applying a solder mask to the portions of said laminate second side which are desired to be protected from solder in subsequent fabrication operations of said printed circuit board, whereby is obtained a printed circuit board having a solder mask on both sides.

15. The method of claim 13 wherein said electroplated protective conductive metallic material comprises a tin/lead alloy.

16. The method of claim 13 wherein said electroplated protective conductive metallic material comprises gold.

17. The method of claim 13 wherein said first electroplating step further comprises electroplating a temporary layer of a tin/lead alloy over said electroplated copper, and which method further includes the additional step of removing said temporary layer of tin/lead alloy prior to said first side solder mask application whereby the presence of said tin/lead alloy may serve to protect the electroplated copper during the first etching operation.

* * * * *